(12) United States Patent
Barsegyan

(10) Patent No.: US 8,344,809 B2
(45) Date of Patent: Jan. 1, 2013

(54) SYSTEM AND METHOD FOR ADJUSTING GAIN FREQUENCY RESPONSE OF RF POWER AMPLIFIER

(75) Inventor: Apet Barsegyan, Glendale, CA (US)

(73) Assignee: Integra Technologies, Inc., El Segundo, CA (US)

( * ) Notice: Subject to any disclaimer, the term of this patent is extended or adjusted under 35 U.S.C. 154(b) by 0 days.

(21) Appl. No.: 13/101,033

(22) Filed: May 4, 2011

(65) Prior Publication Data

US 2012/0280753 A1    Nov. 8, 2012

(51) Int. Cl.
*H03F 3/191* (2006.01)

(52) U.S. Cl. ........................................ 330/302

(58) Field of Classification Search .............. 330/277, 330/302, 306, 307
See application file for complete search history.

(56) References Cited

U.S. PATENT DOCUMENTS

| | | | |
|---|---|---|---|
| 6,498,535 B1* | 12/2002 | Allen et al. | 330/302 |
| 6,614,311 B2* | 9/2003 | Takenaka | 330/302 |
| 6,653,905 B2* | 11/2003 | Ishibayashi | 330/302 |
| 7,511,573 B2* | 3/2009 | Lee et al. | 330/302 |

* cited by examiner

*Primary Examiner* — Khanh V Nguyen
(74) *Attorney, Agent, or Firm* — Fountain Law Group, Inc.; George L. Fountain; Vy H. Vu

(57) ABSTRACT

A radio frequency (RF) amplifier is disclosed including an active device adapted to amplify an input signal in accordance with a gain frequency response to generate an output signal, and a dissipative circuit adapted to modify the gain frequency response by dissipating the input or output signal more so at a first frequency range than at a second frequency range. The dissipative circuit may include a resistive element, and an open circuit adapted to operate as an open at a specified frequency to substantially minimize the dissipation of the input or output signal through the resistive element at the specified frequency. The open circuit may include an open-ended transmission line having an electrical length of a half wavelength or multiple thereof at the specified frequency. Alternatively, the open circuit may include a short-ended transmission line having an electrical length of a quarter wavelength or odd multiple thereof at the specified frequency.

23 Claims, 3 Drawing Sheets

US 8,344,809 B2

SYSTEM AND METHOD FOR ADJUSTING GAIN FREQUENCY RESPONSE OF RF POWER AMPLIFIER

FIELD

This invention relates generally to radio frequency (RF) circuits, and in particular, to a system and method for adjusting gain frequency response of an RF amplifier.

BACKGROUND

Radio frequency (RF) amplifiers typically use active devices, such as field effect transistors (FET) and bipolar junction transistors (BJT), to perform the amplification of signals. These active devices typically have a gain that decreases monotonically with frequency. For instance, many of these devices have a gain slope of about six (6) decibels (dB) per octave of frequency. Additionally, incorporating such devices into packages may worsen the gain slope. In many applications, without correction, such a gain slope is often undesirable because it may lead to poor signal quality and/or other undesirable characteristics.

Although, in most cases, the gain of an active device used in RF amplifiers decreases with increasing frequency, in some cases, the gain actually increases with increasing frequency over a particular frequency range. Nonetheless, the changes in gain with frequency, whether increasing or decreasing, results in an uneven gain frequency response. As discussed above, this may be undesirable for certain applications. In general, it may be desirable to adjust the inherent or uncompensated gain frequency response of an RF amplifier to a more desirable gain frequency response.

SUMMARY

An aspect of the disclosure relates to a radio frequency (RF) amplifier, comprising an active device adapted to amplify an input signal in accordance with a gain frequency response to generate an output signal, and a dissipative circuit adapted to modify the gain frequency response by dissipating the input or output signal more so at a first frequency range than at a second frequency range.

According to another aspect, the dissipative circuit comprises a resistive element, and an open circuit adapted to operate as an open at a specified frequency to substantially minimize the dissipation of the input or output signal at the specified frequency. In another aspect, the specified frequency is closer to the second frequency range than the first frequency range.

According to another aspect, the open circuit comprises an open-ended transmission line having an electrical length of a half wavelength or multiple thereof at the specified frequency. In another aspect, the open-ended transmission line includes a first section having a first characteristic impedance, and a second section having a second characteristic impedance, wherein the first characteristic impedance is less than the second characteristic impedance. In yet another aspect, the resistive element is directly coupled to the first section of the open-ended transmission line. In still another aspect, the second section of the open-ended transmission line includes an open end.

According to another aspect, the open circuit comprises a short-ended transmission line having an electrical length of a quarter wavelength or odd multiple thereof at the specified frequency. In another aspect, the short-ended transmission line includes a first section having a first characteristic impedance, and a second section having a second characteristic impedance, wherein the first characteristic impedance is less than the second characteristic impedance. In yet another aspect, the resistive element is directly coupled to the first section of the short-ended transmission line. In still another aspect, the second section of the short-ended transmission line includes a shorted end.

According to another aspect of the invention, the RF amplifier further comprises an input transmission line coupled to an input of the active device, wherein the resistive element is coupled to the input transmission line. In still another aspect, the RF amplifier further comprises an output transmission line coupled to an output of the active device, wherein the resistive element is coupled to the output transmission line. In yet another aspect, the active device comprises a field effect transistor (FET). In still another aspect, the active device comprises a bipolar junction transistor (BJT).

According to another aspect of the invention, the RF amplifier further comprises an input impedance matching network coupled to an input of the active device, wherein the dissipative circuit is coupled to the input of the active device. In another aspect, the RF amplifier further comprises an output impedance matching network coupled to an output of the active device, wherein the dissipative circuit is coupled to the output of the active device.

Other aspects, advantages and novel features of the present disclosure will become apparent from the following detailed description when considered in conjunction with the accompanying drawings.

DETAILED DESCRIPTION OF THE EXEMPLARY EMBODIMENTS

Figure 1:
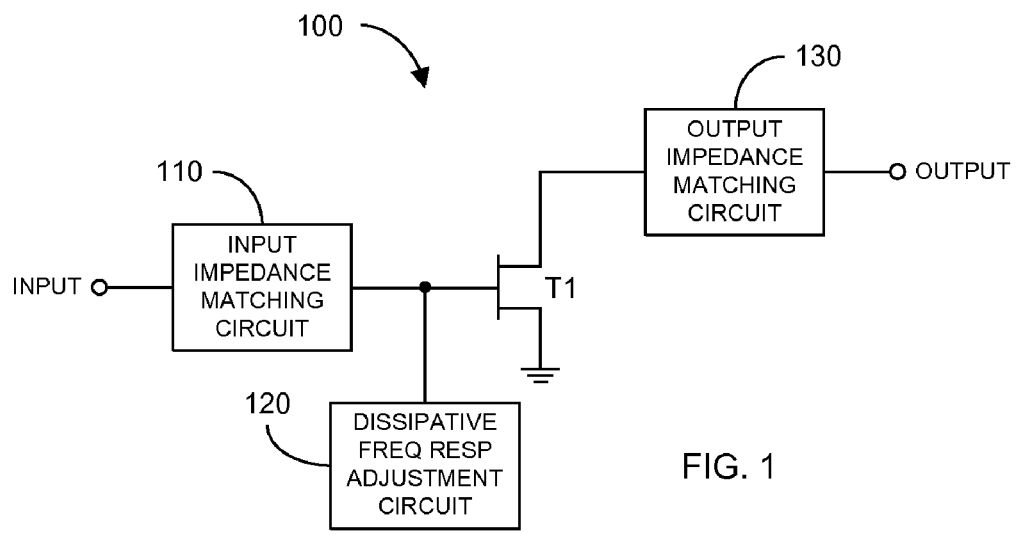
FIG. 1 illustrates a block/schematic diagram of an exemplary RF amplifier in accordance with an aspect of the disclosure.

FIG. 1 illustrates a block/schematic diagram of an exemplary RF amplifier 100 in accordance with an aspect of the disclosure. In summary, the RF amplifier 100 includes a dissipative circuit adapted to adjust the inherent or uncompensated gain frequency response of the RF amplifier in order to provide a more desirable gain frequency response. In particular, the dissipative circuit is adapted to reduce the gain of the RF amplifier 100 around a particular frequency or frequency range, while leaving the gain associated with another frequency or frequency range substantially unaffected.

More specifically, the RF amplifier 100 comprises an input impedance matching circuit 110, a dissipative frequency response adjustment circuit 120, an active device T1, and an output impedance matching circuit 130. The input impedance matching circuit 110 is adapted to improve the matching between the characteristic impedance of an input transmission line (e.g. $Z_O \sim 50$ Ohms) and the impedance of the input of the active device T1, which may be relatively low (e.g., <1 Ohm) for a power device. The input impedance matching circuit 110 may be configured as one or more discrete devices, one or more metallization traces on a substrate, or any combination thereof.

The dissipative frequency response adjustment circuit 120 is adapted to modify the inherent or uncompensated gain frequency response of the RF amplifier 100. In this regards, the dissipative circuit 120 is adapted to decrease the gain of the RF amplifier 100 for a particular frequency or frequency range, while substantially not affecting the gain of the RF amplifier 100 at another frequency or frequency range. The dissipative circuit 120 may be coupled to the input of the active device T1 in a shunt manner. As discussed in more detail below, the dissipative circuit may comprise a resistive element coupled to an open-ended or short-ended transmission having a specified electrical length configured to minimize losses through the resistive element at a specified frequency or frequency range.

The active device T1 performs the amplification of the received input signal to generate an output signal. The active device T1 may be configured as any variation of a field effect transistor (FET), bipolar junction transistor (BJT), or other type of transistor. In the example shown, the active device T1 is a FET having a gate coupled to the input impedance matching circuit 110 and the dissipative frequency response adjustment circuit 120. The FET T1 may have a source coupled to ground, and a drain coupled to the output impedance matching network 130.

The output impedance matching circuit 130 is adapted to improve the matching between the impedance of the output of the active device T1, which also may be relatively low (e.g., <1 Ohm) due to the paralleling of many transistor cells for a power device, and the characteristic impedance of the output transmission line (e.g. $Z_O \sim 50$ Ohms). The output impedance matching circuit 130 may be configured as one or more discrete devices, one or more metallization traces on a substrate, or any combination thereof.

Figure 2:
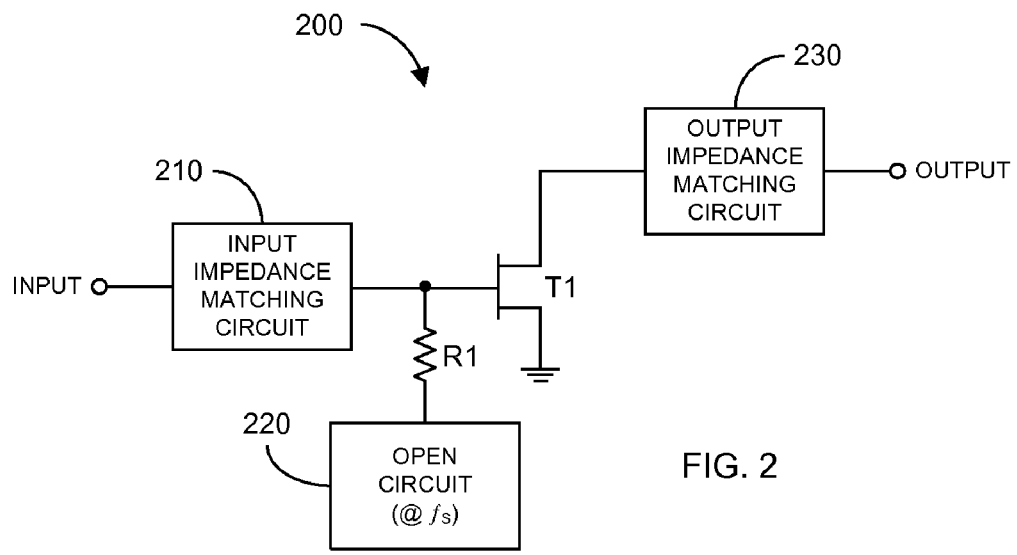
FIG. 2 illustrates a block/schematic diagram of another exemplary RF amplifier in accordance with another aspect of the disclosure.

FIG. 2 illustrates a block/schematic diagram of another exemplary RF amplifier 200 in accordance with another aspect of the disclosure. The RF amplifier 200 is similar to that of RF amplifier 100, but includes a more detailed exemplary embodiment of the dissipative frequency response adjustment circuit previously discussed.

More specifically, the RF amplifier 200 comprises an input impedance matching circuit 210, a dissipative frequency response adjustment circuit comprising a resistive element R1 and an open circuit 220, an active device T1 (e.g., a FET), and an output impedance matching circuit 230. Similar to the previous embodiment, the input impedance matching circuit 210 is adapted to improve the matching between the impedances associated with an input transmission line and the input of the active device T1. The active device T1 is adapted to perform the amplification of the received input signal to generate an output signal. And, the output impedance matching circuit 230 is adapted to improve the matching between the impedances associated with the output of the active device T1 and the output transmission line.

As discussed above, the dissipative frequency response adjustment circuit includes the resistive element R1 (e.g., a thick- or thin-film resistor) and the open circuit 220. The open circuit 220 is adapted to present an open circuit to the input signal at a specified frequency fs. This results in substantially no dissipation of the input signal at the specified frequency fs through the resistive element R1. However, for other frequencies (e.g., f≠fs) of the input signal, the open circuit 220 may no longer operate as an open circuit. Thus, for those frequencies, dissipation of the input signal occurs through the resistive element R1.

As an example, if the active device T1 has an inherent monotonically decreasing gain with increasing frequency (e.g., 6 dB/octave), then the open circuit 220 may be configured to present an open circuit to the specified frequency fs near or at the upper end of the operating bandwidth of the RF amplifier 200. In this way, substantially no dissipation of the input signal at the upper end of the bandwidth occurs through the resistive element R1. However, at the lower or middle range of the bandwidth, the open circuit 220 no longer operates as an open circuit. Thus, at the lower and middle portion of the operating bandwidth, there is some signal dissipation through the resistive element R1, and more so at the lower end of the bandwidth. Thus, the gain of the RF amplifier 200 is reduced at the lower and middle portion of the operating bandwidth in order to achieve a more flat gain frequency response over the operating bandwidth of the RF amplifier 200.

Figure 3:
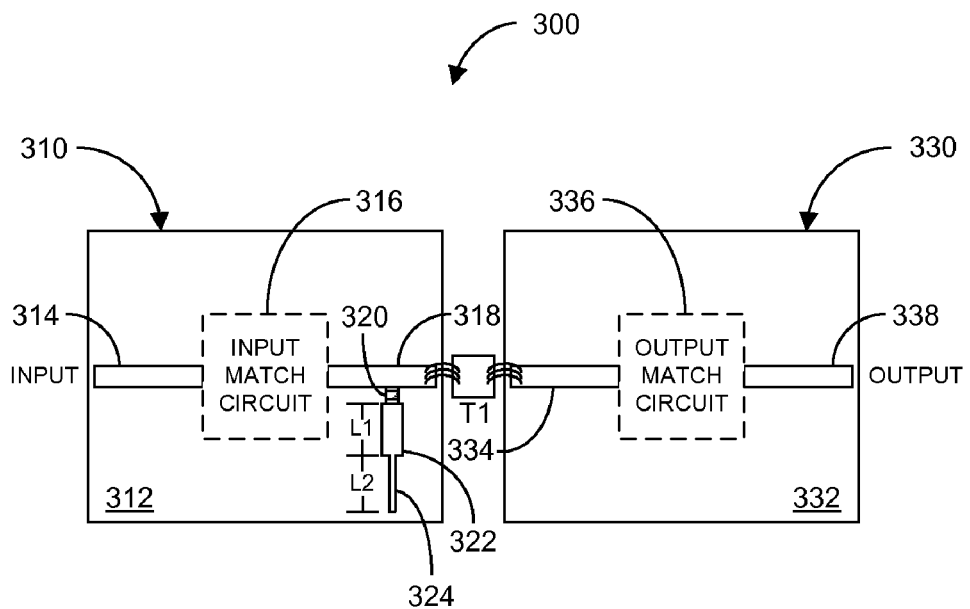
FIG. 3 illustrates a top view of yet another exemplary RF amplifier in accordance with another aspect of the disclosure.

FIG. 3 illustrates a top view of yet another exemplary RF amplifier 300 in accordance with another aspect of the disclosure. The RF amplifier 300 may be an example of a particular implementation of the RF amplifier 100 or 200 previously discussed. In this particular example, the dissipative frequency response adjustment circuit includes a resistive element (e.g., a thick-film resistor) and an open-ended transmission line. As discussed in more detail below, the open-ended transmission line is adapted to present an open circuit at the point of attachment to the resistive element at a specified frequency fs. It is configured with an electrical length of substantially a half wavelength or multiple thereof at the specified frequency fs.

In particular, the RF amplifier 300 comprises an input circuit 310, an active device T1 (e.g., a FET), and an output circuit 330. The input circuit 310 comprises a substrate 312 (e.g., a dielectric or semiconductor substrate). The substrate 312 includes first and second input transmission lines 314 and 318 (e.g., metallization traces) adapted to direct an input RF signal to the input of the active device T1. The input circuit 310 further comprises an input impedance matching circuit 316 interposed between the first and second input transmission lines 314 and 318. The input impedance matching network 316 is adapted to improve the matching between the characteristic impedance of the first input transmission line 314 (e.g. $Z_O \sim 50$ Ohms) to the input impedance of the active device T1 (e.g., <1 Ohm).

The input circuit 310 further comprises a dissipative frequency response adjustment circuit including a resistive element 320 (e.g., a thick-film resistor) and an open-ended transmission line (e.g., a metallization trace), both disposed on the substrate 312. In this example, the open-ended transmission line may be configured into two different sections 322 and 324 having lengths L1 and L2, respectively. The section 322 of the open-ended transmission may have a width larger than the width of the other section 324. This may be done to make it easier to attach the thick-film resistor 320 to the open-ended transmission line. As a consequence, the characteristic impedance of the section 322 of the open-ended transmission line is less than the characteristic impedance of the other section 324.

The electrical length (L1+L2) of the open-ended transmission line is configured to be a half wavelength or multiple thereof (e.g., $n*\lambda/2$, n being an integer) at a specified frequency fs. The specified frequency fs may be a particular frequency within or near the operating bandwidth of the RF amplifier 300 where the dissipative frequency response adjustment circuit should not substantially affect the inherent or uncompensated gain of the RF amplifier 300 (e.g., the gain of the RF amplifier without the dissipative circuit).

As an example, if the inherent or uncompensated gain of the RF amplifier 300 monotonically decreases with increasing frequency, then the specified frequency fs may be selected so that it is at or near the upper end of the operating bandwidth of the RF amplifier 300. Thus, at the upper end of the operating bandwidth, there is substantially no dissipation of the input signal through the resistive element 320 because the open-ended transmission line functioning or operating as an open circuit. At the lower or middle portion of the operating bandwidth of the RF amplifier 300, the open-ended transmission line no longer functions or operates as an open circuit. Thus, at the lower and middle portion of the operating bandwidth, dissipation of the input signal occurs through the resistive element 320. This reduces the gain at the lower and middle portion of the operating bandwidth in order to provide a more flat gain across the operating bandwidth of the RF amplifier 300.

In general, the dissipative frequency adjustment circuit may be used to modify an inherent or uncompensated gain frequency response of an RF amplifier so that a more desirable gain frequency response is achieved. For example, if the inherent or uncompensated gain frequency response has a minimum at the center region of the operating bandwidth, the dissipative circuit may be configured to substantially not affect the gain at the center region, and to decrease the gain at the lower and upper regions of the operating bandwidth. Similarly, if the inherent or uncompensated gain frequency response has a minimum at the lower region of the operating bandwidth, the dissipative circuit may be configured to substantially not affect the gain at the lower region, and to decrease the gain at the middle and upper regions of the operating bandwidth. More generally, the desired gain frequency response need not be flat, and could have any desired profile. The dissipative frequency adjustment circuits may be used to achieve such desired gain frequency response for an RF amplifier.

Finally, the output circuit 330 comprises a substrate 332 (e.g., a dielectric or semiconductor substrate). The substrate 332 includes first and second output transmission lines 334 and 338 (e.g., metallization traces) adapted to direct an output RF signal from the output of the active device T1 to an output of the RF amplifier 300. The output circuit 330 further comprises an output impedance matching circuit 336 interposed between the first and second output transmission lines 334 and 338. The output impedance matching network 336 is adapted to improve the matching between the impedance of the output of the active device T1 (e.g., <1 Ohm) and the characteristic impedance of the second output transmission line 338 (e.g. $Z_O$~50 Ohms).

Figure 4:
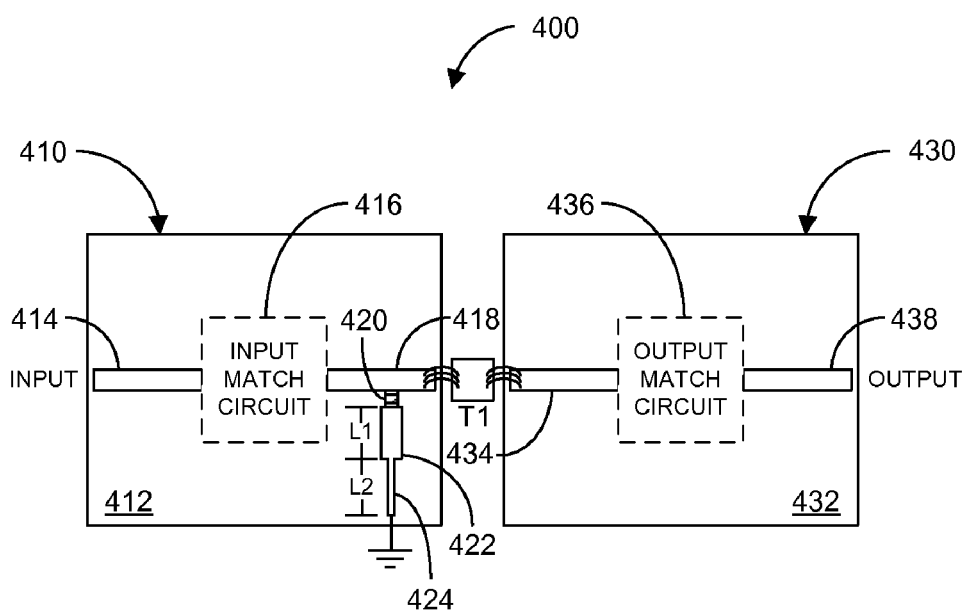
FIG. 4 illustrates a top view of yet another exemplary RF amplifier in accordance with another aspect of the disclosure.

FIG. 4 illustrates a top view of yet another exemplary RF amplifier 400 in accordance with another aspect of the disclosure. The RF amplifier 400 is similar to that of RF amplifier 300, with the exception that the dissipative frequency response adjustment circuit is configured differently. In particular, the dissipative frequency adjustment circuit is configured with a short-ended transmission line, instead of an open-ended transmission line.

As in the previous embodiment, the RF amplifier 400 comprises an input circuit 410, an active device T1 (e.g., a FET), and an output circuit 430. The input circuit 410, in turn, comprises a first input transmission line 414 disposed on a substrate 412, an input impedance matching circuit 416 formed on the substrate 412, and a second input transmission line 418 disposed on the substrate 412, all connected in series between an input of the RF amplifier 400 and the input (e.g., gate) of the active device T1. Similarly, the output circuit 430, in turn, comprises a first output transmission line 434 disposed on a substrate 432, an output impedance matching circuit 436 formed on the substrate 432, and a second output transmission line 438 disposed on the substrate 432, all connected in series between the output (e.g., drain) of the active device T1 and the output of the RF amplifier 400.

The input circuit 410 further comprises a dissipative frequency response circuit adapted to adjust the inherent or uncompensated gain frequency response of the RF amplifier 400. The dissipative circuit comprises a resistive element 420 (e.g., a thick-film resistor) and a short-ended transmission line, both disposed on the substrate 412. The resistive element 420 and the short-ended transmission line are coupled between the second input transmission line 418 and ground potential, which may be effectuated by a metalized via hole or a wrap-around ribbon electrically coupled to a grounded metallization layer disposed on the bottom surface of the substrate 412.

In this example, the short-ended transmission line may be configured into two different sections 422 and 424 having lengths L1 and L2, respectively. The section 422 of the short-ended transmission may have a width larger than the width of the other section 424. This may be done to make it easier to attach the thick-film resistor 420 to the short-ended transmission line. As a consequence, the characteristic impedance of the section 422 of the short-ended transmission line is less than the characteristic impedance of the other section 424. The short-ended transmission line has an electrical length (L1+L2) of a quarter wavelength or odd multiple thereof (e.g., $m*\lambda/4$, m being an odd integer) at a specified frequency fs. The specified frequency fs may be a particular frequency within or near the operating bandwidth of the RF amplifier 400 where the dissipative frequency response adjustment circuit should not substantially affect the inherent or uncompensated gain of the RF amplifier 400.

Figure 5:
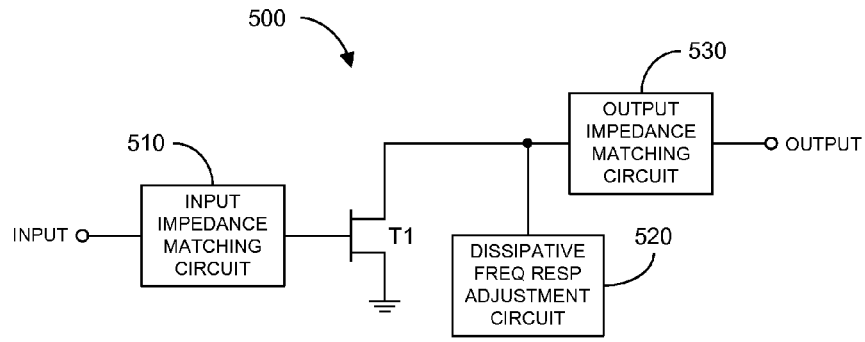
FIG. 5 illustrates a block/schematic diagram of yet another exemplary RF amplifier in accordance with another aspect of the disclosure.

FIG. 5 illustrates a block/schematic diagram of yet another exemplary RF amplifier 500 in accordance with another aspect of the disclosure. In the previous embodiments, the dissipative frequency response circuit is located at the input side of the RF amplifier. In the RF amplifier 500, on the other hand, the dissipative frequency response circuit is located at the output side of the RF amplifier. In some applications, placing the dissipative circuit at the output side of the RF amplifier may be beneficial.

In particular, the RF amplifier 500 comprises an input impedance matching circuit 510, an active device T1 (e.g., a FET), an output impedance matching circuit 530, and a dissipative frequency response adjustment circuit 520. Similar to the previous embodiments, the input impedance matching circuit 510 improves the matching between the characteristic impedance associated with the input of the RF amplifier 500 and the impedance of the input (e.g., gate) of the active device T1. Similarly, the output impedance matching circuit 530 improves the matching between the impedance of the output (e.g., drain) of the active device T1 and the characteristic impedance associated with the output of the RF amplifier 500. The dissipative frequency response adjustment circuit 520 is coupled in shunt with the output of the active device T1, and may be configured similarly to the dissipative circuits previously discussed.

Figure 6:
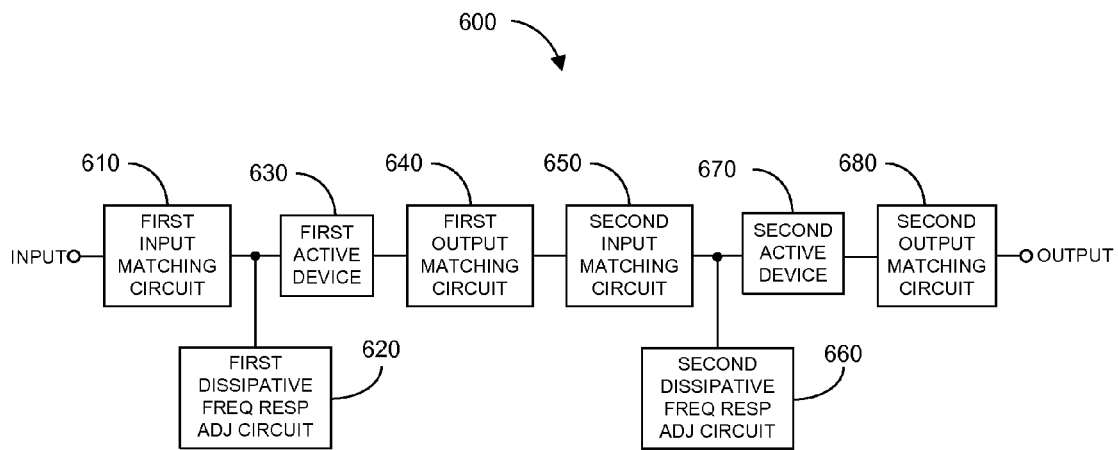
FIG. 6 illustrates a block/schematic diagram of still another exemplary RF power amplifier in accordance with another aspect of the disclosure.

FIG. 6 illustrates a block/schematic diagram of still another exemplary RF power amplifier 600 in accordance with another aspect of the disclosure. In summary, the RF amplifier 600 is configured as a multi-stage amplifier that includes one or more dissipative frequency response adjustment circuits anywhere along the chain of amplification stages. In this example, however, the RF amplifier 600 comprises two (2) amplification stages with two the dissipative frequency response adjustment circuits coupled to the inputs of the stages, respectively.

In particular, the RF amplifier 600 comprises a first amplification stage including a first input impedance matching circuit 610, a first active device 630, a first output matching circuit 640, and a first dissipative frequency response adjustment circuit 620. These elements may be configured similarly to corresponding elements of previous embodiments. The RF amplifier 600 further comprises a second amplification stage including a second input impedance matching circuit 650, a second active device 670, a second output matching circuit 680, and a second dissipative frequency response adjustment circuit 660. These elements may also be configured similarly to corresponding elements of previous embodiments. As previously discussed, in this example, the dissipative circuits are located at the input side of each amplification stage. However, it shall be understood that the dissipative circuit may be placed anywhere along the chain of a multi-stage RF amplifier.

While the invention has been described in connection with various embodiments, it will be understood that the invention is capable of further modifications. This application is intended to cover any variations, uses or adaptation of the invention following, in general, the principles of the invention, and including such departures from the present disclosure as come within the known and customary practice within the art to which the invention pertains.

What is claimed is:

1. A radio frequency (RF) amplifier, comprising:
   an active device adapted to amplify an input signal in accordance with a gain frequency response to generate an output signal, wherein the gain frequency response substantially monotonically decreases from a lower frequency end to an upper frequency end of an operating band of the RF amplifier; and
   a dissipative circuit adapted to generate a dissipation frequency response of the input or output signal that substantially monotonically decreases from the lower frequency end to the upper frequency end of the operating band in order to achieve an overall gain frequency response for the RF amplifier that is flatter than the gain frequency response of the active device over the operating band of the RF amplifier.

2. The RF amplifier of claim 1, wherein the dissipative circuit comprises:
   a resistive element; and
   a circuit adapted to operate substantially as an open at or proximate the upper frequency end to substantially minimize the dissipation of the input or output signal through the resistive element at or proximate the upper frequency end of the operating band of the RF amplifier.

3. The RF amplifier of claim 2, wherein the circuit comprises an open-ended transmission line having an electrical length of a half wavelength or multiple thereof at or proximate the upper frequency end of the operating band of the RF amplifier.

4. The RF amplifier of claim 3, wherein the open-ended transmission line includes a first section having a first characteristic impedance, and a second section having a second characteristic impedance, wherein the first characteristic impedance is less than the second characteristic impedance.

5. The RF amplifier of claim 4, wherein the resistive element is directly coupled to the first section of the open-ended transmission line.

6. The RF amplifier of claim 4, wherein the second section of the open-ended transmission line includes an open end.

7. The RF amplifier of claim 2, wherein the circuit comprises a short-ended transmission line having an electrical length of a quarter wavelength or odd multiple thereof at or proximate the upper frequency end of the operating band of the RF amplifier.

8. The RF amplifier of claim 7, wherein the short-ended transmission line includes a first section having a first characteristic impedance, and a second section having a second characteristic impedance, wherein the first characteristic impedance is less than the second characteristic impedance.

9. The RF amplifier of claim 8, wherein the resistive element is directly coupled to the first section of the short-ended transmission line.

10. The RF amplifier of claim 8, wherein the second section of the short-ended transmission line includes a shorted end.

11. The RF amplifier of claim 2, further comprising an input transmission line coupled to an input of the active device, wherein the resistive element is coupled to the input transmission line.

12. The RF amplifier of claim 2, further comprising an output transmission line coupled to an output of the active device, wherein the resistive element is coupled to the output transmission line.

13. The RF amplifier of claim 1, wherein the active device comprises a field effect transistor (FET).

14. The RF amplifier of claim 1, wherein the active device comprises a bipolar junction transistor (BJT).

15. The RF amplifier of claim 1, further comprising an input impedance matching network coupled to an input of the active device, wherein the dissipative circuit is coupled to the input of the active device.

16. The RF amplifier of claim 1, further comprising an output impedance matching network coupled to an output of the active device, wherein the dissipative circuit is coupled to the output of the active device.

17. A radio frequency (RF) amplifier, comprising:
   an active device adapted to amplify an input signal in accordance with a gain frequency response to generate an output signal; and
   a dissipative circuit adapted to modify the gain frequency response by dissipating the input or output signal more so at a first frequency range than at a second frequency range, wherein the dissipative circuit comprises:
   a resistive element; and
   an open circuit adapted to operate as an open at a specified frequency to substantially minimize the dissipation of the input or output signal through the resistive element at the specified frequency, wherein the open circuit comprises an open-ended transmission line having an electrical length of a half wavelength or multiple thereof at the specified frequency, wherein the open-ended transmission line includes a first section having a first characteristic impedance, and a second section having a second characteristic impedance, and wherein the first characteristic impedance is less than the second characteristic impedance.

18. The RF amplifier of claim 17, wherein the resistive element is directly coupled to the first section of the open-ended transmission line.

19. The RF amplifier of claim 17, wherein the second section of the open-ended transmission line includes an open end.

20. A radio frequency (RF) amplifier, comprising:

an active device adapted to amplify an input signal in accordance with a gain frequency response to generate an output signal; and a dissipative circuit adapted to modify the gain frequency response by dissipating the input or output signal more so at a first frequency range than at a second frequency range, wherein the dissipative circuit comprises:

a resistive element; and an open circuit adapted to operate as an open at a specified frequency to substantially minimize the dissipation of the input or output signal through the resistive element at the specified frequency, wherein the open circuit comprises a short-ended transmission line having an electrical length of a quarter wavelength or odd multiple thereof at the specified frequency, wherein the short-ended transmission line includes a first section having a first characteristic impedance, and a second section having a second characteristic impedance, and wherein the first characteristic impedance is less than the second characteristic impedance.

21. The RF amplifier of claim 20, wherein the resistive element is directly coupled to the first section of the short-ended transmission line.

22. The RF amplifier of claim 20, wherein the second section of the short-ended transmission line includes a shorted end.

23. A radio frequency (RF) amplifier, comprising:

an active device adapted to amplify an input signal in accordance with a gain frequency response to generate an output signal;

a dissipative circuit adapted to modify the gain frequency response by dissipating the input or output signal more so at a first frequency range than at a second frequency range, wherein the dissipative circuit comprises:

a resistive element; and an open circuit adapted to operate as an open at a specified frequency to substantially minimize the dissipation of the input or output signal through the resistive element at the specified frequency; and an output transmission line coupled to an output of the active device, wherein the resistive element is coupled to the output transmission line.

* * * * *